United States Patent
Thanner et al.

(10) Patent No.: US 9,519,013 B2
(45) Date of Patent: Dec. 13, 2016

(54) MODE-CONTROLLED VOLTAGE EXCURSION DETECTOR APPARATUS AND A METHOD OF OPERATING THEREOF

(71) Applicants: Manfred Thanner, Neubiberg (DE); Carl Culshaw, Wigan (GB); Sunny Gupta, Noida (IN)

(72) Inventors: Manfred Thanner, Neubiberg (DE); Carl Culshaw, Wigan (GB); Sunny Gupta, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 190 days.

(21) Appl. No.: 14/445,679

(22) Filed: Jul. 29, 2014

(65) Prior Publication Data

US 2016/0033560 A1 Feb. 4, 2016

(51) Int. Cl.
 *G01R 31/40* (2014.01)
 *G01R 19/165* (2006.01)

(52) U.S. Cl.
 CPC .............................. *G01R 19/16552* (2013.01)

(58) Field of Classification Search
 CPC ............... G06F 11/30; G01R 19/16552; G01R 19/16571; G01R 31/2829; G01R 31/3004; G01R 13/02; G01R 19/0084; G01R 31/007; G01R 31/362; G01R 31/3668; G01R 31/3679; G01R 31/3682; B60R 21/0173; H03F 1/305
 See application file for complete search history.

(56) References Cited

U.S. PATENT DOCUMENTS

| | | | | | |
|---|---|---|---|---|---|
| 3,354,448 | A | * | 11/1967 | Brolin | H02H 3/202 327/74 |
| 3,679,912 | A | * | 7/1972 | Tenenbaum | H02H 3/202 327/466 |
| 4,714,877 | A | * | 12/1987 | Kong | G01R 19/16557 324/133 |
| 4,843,533 | A | * | 6/1989 | Roof | H02H 7/1216 361/111 |
| 6,100,716 | A | * | 8/2000 | Adham | H03K 5/08 326/126 |

OTHER PUBLICATIONS

Maxim Integrated Products, "High-Voltage, Low-Current Voltage Monitors in SOT Packages," Data Sheet, MAX6457-MAX6460; Rev 3; Sunnyvale, CA; Jan. 2007; 16 pages.

* cited by examiner

*Primary Examiner* — Vinh Nguyen

(57) ABSTRACT

A mode-controlled voltage excursion detector apparatus for monitoring a supply voltage of a power supply applied to a load and a method of operating thereof is described. A voltage monitor is configured to detect an excursion event if the supply voltage exceeds or falls below at least one defined threshold, to generate an excursion event signal upon detection of the excursion event and to provide the generated excursion event signal to the excursion event output for being outputted via an excursion event output. A sensitivity control module is configured to receive a signal indicative of potential voltage excursions. A sensitivity control module is further operatively coupled to the sensitivity control input and configured to disable the outputting of an excursion event signal generated during a defined period of time in response to the reception of the signal, which triggers the disabling of the outputting.

14 Claims, 9 Drawing Sheets

… (1)

MODE-CONTROLLED VOLTAGE EXCURSION DETECTOR APPARATUS AND A METHOD OF OPERATING THEREOF

FIELD OF THE INVENTION

The present invention generally relates to the field of voltage overvoltage/undervoltage detectors. In particular, the present invention relates to the field of voltage overvoltage/undervoltage detectors with mode-controlled sensitivity for temporarily disabling monitoring of a supply voltage.

BACKGROUND OF THE INVENTION

Electronic circuits occasionally undergo such a state that a power supply voltage exceeds or falls below an operating voltage range. Such electronic circuits often include components, which are sensitive to voltage excursions of the power supply, such as microprocessors (μP, MPU), microcontrollers (μC, MCU) or systems-on-chip (SoC). When the power supply voltage applied to an MPU, an MCU or an SoC deviates from an operating voltage range, the MPU, the MCU or the SoC may be in an unknown state, thus causing unpredictable behaviour.

Various approaches have been developed in the past to solve such a problem. One known approach includes using a low voltage detector in an electronic circuit. The low voltage detector incorporated in the electronic circuit senses or detects whether the power supply voltage falls below a predetermined threshold voltage, and then outputs a signal for resetting or halting at least the part(s) of the electronic circuit sensitive to power supply voltage excursions, thereby preventing that/those part(s) from malfunctioning.

Analogously, a high voltage detector may be used to protect electronic circuits from unknown states. The high voltage detector incorporated in the electronic circuit senses or detects whether the power supply voltage exceeds a predetermined threshold voltage, and then outputs a signal for resetting or halting at least the part(s) of the electronic circuit sensitive to power supply voltage excursions, thereby preventing that/those part(s) from malfunctioning.

In general, the high/low voltage detector always senses or detects the power supply voltage regardless of an operating state of the microcontroller.

SUMMARY OF THE INVENTION

The invention provides a mode-controlled voltage excursion detector apparatus and method of operating the mode-controlled voltage excursion detector apparatus as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In particular, aspects and advantages can be seen on review of the drawings, the detailed description and the claims, which follow.

DETAILED DESCRIPTION OF THE PREFERRED EMBODIMENTS

Figure 1:
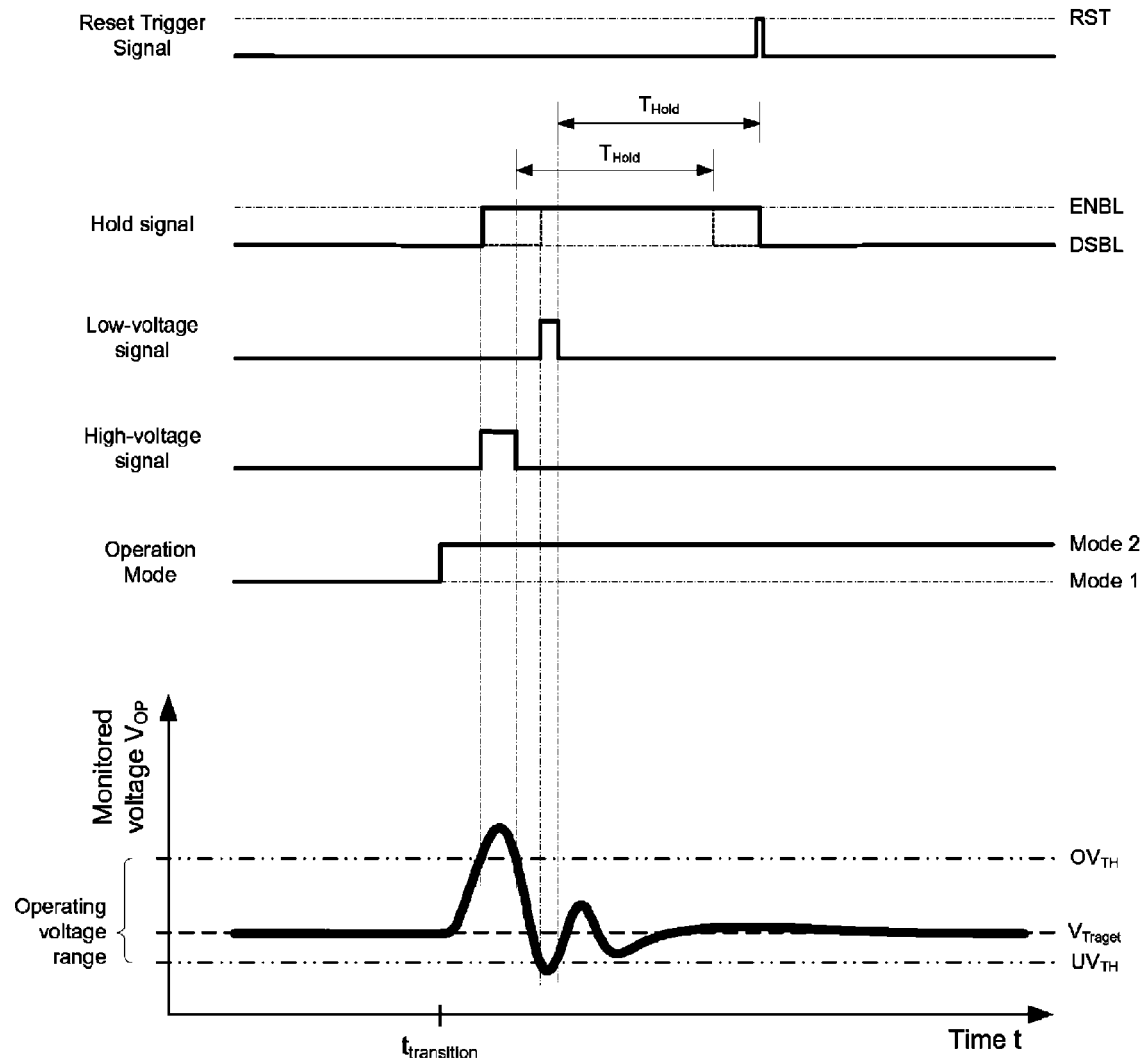
FIG. 1 schematically illustrates a diagram showing the change in the voltage over time of power supply supplying current to an electronic circuitry according to an example of the present application.

Further details, aspects and embodiments of the invention will be described, by way of example only, with reference to the drawings. In particular, aspects and advantages can be seen on review of the drawings, the detailed description and the claims, which follow.

It is understood that the following disclosure provides many different embodiments, or examples, capable of implementing different features. Specific examples of components and arrangements are described below to simplify and thus clarify the present disclosure. These are, of course, merely examples and are not intended to be limiting. In many instances, the features of one embodiment may be combined with the features of other embodiments. In addition, the present disclosure may repeat reference numerals and/or letters in the various exemplary embodiments. This repetition is for the purpose of simplicity and clarity and does not in itself dictate a relationship between the various embodiments and/or configurations discussed.

The detection of power supply voltage excursions, e.g. overvoltage and undervoltage detection, has proved useful to reduce the risk of electronic circuitries having unknown state. Electronic circuitries in the field of individual and/or public transportation including in particular the fields of automotive, aeronautics and rail transportation have to meet conflicting requirements on safety and availability. The safety requirement is inter alia addressed by the aforementioned detection of power supply voltage excursions, which are used to trigger halting and/or resetting sensitive electronic circuitries to maintain and/or restore the deterministic state of the electronic circuitries in response to detection of a power supply voltage being out of a valid operating voltage range.

However, halting and/or resetting electronic circuitries implies that the electronic circuitries is at least temporarily inoperative and unavailable, respectively, which is in conflict with the requirement of availability. In order to improve the availability without degrading the level of safety, there is a need to keep the number of false detections of power supply voltage excursions low, e.g. to only take actions in response to detected voltage excursions, which are considered to have potential effect on the deterministic state of the electronic circuitries. Additionally many electronic circuitries have an added level of voltage operation availability, particularly if these voltage excursions can be kept predictably short over a device lifetime.

FIG. 1 schematically illustrates the change in the voltage over time of a power supply supplying current to an electronic circuitry according to an example of the present application. The illustration exemplifies the change of a supply voltage $V_{OP}$ applied to an electronic load represented by the electronic circuitry. The electronic load is designed to operate at a target supply voltage $V_{Traget}$. The supply voltage may vary within a predefined operating voltage range defined by an overvoltage threshold $OV_{TH}$ and an undervoltage threshold $UV_{TH}$. The proper functioning of the electronic circuitry is assumed as long as the supply voltage $V_{OP}$ is within the operating voltage range. However, voltage excursions may for instance occur due to capacitive unloading, charging or reloading processes in the electronic load. With reference to FIG. 1, the change in a monitored supply voltage $V_{OP}$ over time with a voltage excursion is illustratively shown. Such a voltage excursion is for instance caused by changing the operation mode of one or more parts of the electronic circuitry at point in time $t_{Mode}$. The change of the operation mode may involve one or more of the aforementioned capacitive unloading, charging or reloading processes.

Upon the supply voltage $V_{OP}$ exceeding the overvoltage threshold $OV_{TH}$, a voltage excursion detector detects an overvoltage excursion event schematically illustrated as "high-voltage signal". Upon the supply voltage $V_{OP}$ falling below the undervoltage threshold $UV_{TH}$, a voltage excursion detector detects an undervoltage excursion event schematically illustrated as "low-voltage signal". Because voltage excursion events may cause an unknown state of the electronic circuitry, a reset may be triggered to reinitialize the electronic circuitry in order to ensure/restore a proper functioning thereof. As exemplarily illustrated, the overvoltage excursion event triggers the setting of a hold-enabled signal (ENBL), which may be supplied to the electronic circuitry and in response to which the electronic circuitry halts the operation thereof (e.g. the electronic circuitry enters a halt state). Any overvoltage and undervoltage excursion event may trigger the setting of the hold-enabled signal (ENBL). The hold-enabled signal (ENBL) is maintained at least as long as an overvoltage/undervoltage excursion is detected and the overvoltage/undervoltage excursion event is present, respectively. The hold-enabled signal (ENBL) may be further maintained over a predetermined period of time $T_{Hold}$ after the overvoltage/undervoltage excursion. As exemplarily shown in FIG. 1, a timer triggering the setting of a hold-enabled signal (ENBL) for a predetermined period of time $T_{Hold}$ may be started/re-started each time an overvoltage/undervoltage excursion event is detected. This means that the period, over which the hold-enabled signal (ENBL) is maintained, may be extended in that the timer is re-started each time of a detection of an overvoltage/undervoltage excursion event within one or more overlapping periods of time $T_{Hold}$, during which the hold-enabled signal (ENBL) is maintained.

In particular, the timer may be started at a falling edge of the low-/high-voltage signal to maintain the setting of the hold-enabled signal (ENBL). The predetermined period of time $T_{Hold}$ may be configurable. The predetermined period of time $T_{Hold}$ may be the same or different for overvoltage and undervoltage excursion events.

After expiration of the (last) predetermined period of time $T_{Hold}$, a reset signal is generated, which is for instance supplied to the electronic circuitry for resetting at least one or more parts thereof. The reset signal may be generated at falling edge of the hold signal transitioning from hold-enabled signal (ENBL) state to hold disabled signal (DSBL) state.

Figure 2:
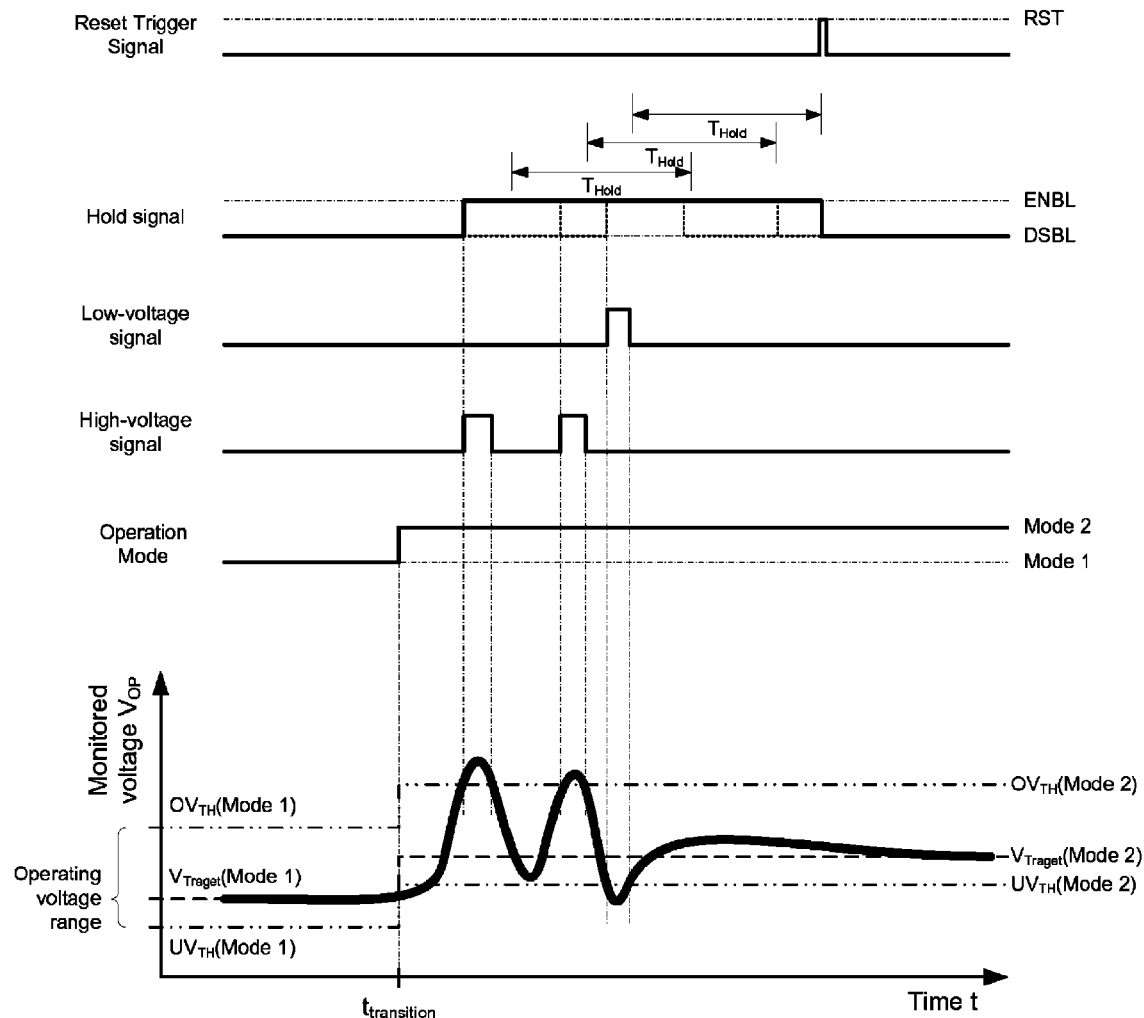
FIG. 2 schematically illustrates a diagram showing the change in the voltage over time of power supply supplying current to an electronic circuitry according to a further example of the present application.

FIG. 2 schematically illustrates the change in the supply voltage over time of the power supply supplying current to an electronic circuitry according to a further example of the present application. The illustration exemplifies the change of a supply voltage $V_{OP}$ applied to an electronic load represented by the electronic circuitry. The electronic load in this example is designed to operate at a target supply voltage $V_{Traget}(mode)$, which is a function of the operation mode of the electronic circuitry. This means that target supply voltage may change when the operation mode of the electronic circuitry transitions from one to another mode. The supply voltage may vary within a predefined operating voltage range with regard to the target supply voltages $V_{Traget}$ (mode) of a current operation mode. The predefined operating voltage range is defined by an overvoltage threshold $OV_{TH}(mode)$ and an undervoltage threshold $UV_{TH}(mode)$, which are also functions of the operation mode. The overvoltage/undervoltage thresholds envelope the target supply voltage $V_{Traget}(mode)$ and are accordingly adapted thereto. The proper functioning of the electronic circuitry is assumed as long as the supply voltage $V_{OP}$ is within the operating voltage range of the respective target supply voltage $V_{Traget}$ (mode) with respect to the current operation mode. The operating voltage range is hence also a function of the operation mode.

The exemplarily illustrated change in the monitored supply voltage $V_{OP}$ over time shows voltage excursion, which is for instance caused by changing from a first target supply voltage $V_{Traget}(Mode\ 1)$ to a second target supply voltages $V_{Traget}(Mode\ 2)$ at a point in time transition in response to the operation mode of the electronic circuitry transitioning from "Mode 1" to "Mode 2". The change of the target supply voltage $V_{Traget}(mode)$ in response to operation mode transition may also involve one or more of the aforementioned capacitive unloading, charging or reloading processes.

Upon the supply voltage $V_{OP}$ exceeding the overvoltage threshold $OV_{TH}$(Mode 2) or falling below the undervoltage threshold $UV_{TH}$(Mode 2), a respective voltage excursion event is detected. Accordingly, the exemplified high-voltage and low-voltage signals are generated and a hold-enabled signal (ENBL) is set and maintained over a predefined or configurable period of time, the start of which is renewed each time a voltage excursion is detected (if the detection occurs during a previously re-/started maintaining period).

After expiration of the (last) predetermined period of time $T_{Hold}$, a reset signal is generated, which is for instance supplied to the electronic circuitry for resetting at least one or more parts thereof.

Complex electronic circuitries such as processor based electronic circuitries including MPUs, MCUs and SoCs have various operating modes, which inter alia adapt the operation of the electronic circuitries to the constraints such as power consumption reduction, thermal load, interference reduction and the like. Those skilled in the art will understand that the aforementioned constraints are interrelated by the current consumption of the electronic circuitries. In particular, with regard to complex electronic circuitries including a huge number of transistors, there are two components that make up the total current consumed by a microcontroller, namely dynamic and static.

The dynamic current is the main current prevalent during normal operating conditions. The mechanism responsible for this current is basically due to charging and discharging the gates of the millions of transistors that switch on and off as an electronic circuitry operates. The dynamic current is highly dependent on the gate capacity, which is a function of the structural size thereof, and the operating frequency.

The static current is present when the transistors of the electronic circuitry are not switching and are hence in a static state. The main mechanism causing this static current is leakage due to the finite resistance that exists between power and ground if power is applied to the electronic circuitry and dependent on the threshold voltage of the transistor.

So-called low-power features are integral part of complex electronic circuitry in order to reduce the power consumption or at least to operate the complex electronic circuitry in a power and/or thermal envelope. The low-power features may address dynamic as well as static current. For instance, complex electronic circuitry may be composed of several independent power and/or frequency domains. Each of the domains may be operated at different base clock frequencies and different internal operating voltages. For instance, an MPU, MCU or SoC may comprise several independent processing cores, wherein each of the processing cores may be individually operated at different clock frequencies and core voltages.

Figure 9:
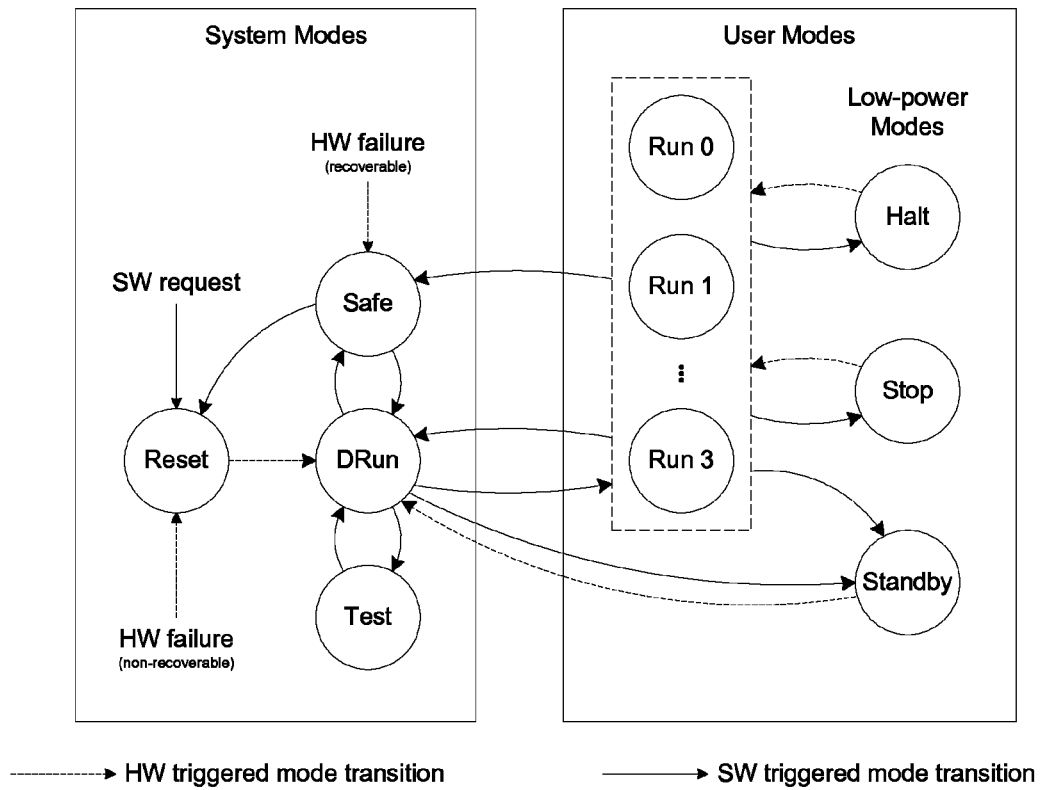
FIG. 9 schematically shows a state diagram depicting operating mode and transitions between them according to an example of the present application.

One or more domains may be switched off or set into one or more low-power modes. The low-power modes may be exemplifies on the basis of the MPC560xB microcontroller family, which in integrated microcontrollers for automotive body electronics applications. It should be understood that the reference to the MPC560xB microcontroller family is merely illustrative for the sake of explanation but should not be considered as limiting. The following description briefly summarizes exemplary low-power modes, which may be entered upon hardware and/or software triggered transitions. The transitions between the different modes are controlled by a mode management circuit, the functionality of which will be better understood after reading the above description. A so-called Mode Entry (ME) module is provided in microcontrollers of the MPC560xB family. The Mode Entry (ME) module is configured to control the mode of a microcontroller and mode transition sequences in all functional states. The Mode Entry (ME) module supports a variety of modes and contains configuration, control and status registers accessible for applications run on the microcontroller. Each mode is configurable. The variety of modes addresses the trade-off between power management and system performance requirements. FIG. 9 schematically shows an exemplary mode diagram of a microcontroller of the MPC560xB family. The operation modes comprise system modes and user modes. The user modes further comprise the low-power modes, which may be entered upon software based trigger requests for mode transition and exited upon hardware based trigger requests for mode transition. The exemplarily depicted low-power modes comprise a Halt mode, a Stop mode and a Standby mode.

The Halt mode is a reduced activity, low-power mode intended for moderate periods of lower processing activity, such as during a slow serial communication. The system returns to Run mode as soon as an event or interrupt is pending. In Halt mode, the processing core(s) is/are stopped but system clock may remain the same as in RUN mode, flash memory may be put in low-power mode and peripherals may continue to run at normal or reduced frequency. The Halt mode may be applied to reduce power consumption during a slow (serial) communication.

The Stop mode maintains power to the entire microcontroller allowing the retention of all on-chip registers and memory, and providing a faster recovery low-power mode than Standby mode, which offers the lowest power consumption. The entire device is powered and RAM is retained. The clocks to the core and peripherals are halted and may be optionally stopped at the expense of a slower start-up time. Wake-up from the Stop mode is triggered by an external event or by the internal periodic wake-up, if enabled. The system clock may be disabled.

The Standby mode halts the clock to the entire microcontroller and turns off the power to the majority domains of the microcontroller to offer the lowest possible power consumption. Only the back-up logic is remained. The microcontroller can be woken up from Standby mode by any of the external wake-up pins, a reset, or from a periodic wake-up. In Standby mode, the contents of the cores, on-chip peripheral registers and potentially some of the volatile memory are not held. This mode consumes the lowest possible power.

From the foregoing description, those skilled in the art will immediately appreciate that power supply voltage excursion events may occur during mode transitions. A voltage excursion detector, which is configured with an overvoltage threshold value and/or an undervoltage threshold value, may indicate a voltage excursion event during a mode transition although such a voltage excursion is imminent thereto and/or inevitable. In particular, resets in response to detected voltage excursion events traceable back to mode transitions contradict to the requirement of availability. Any reset procedure is time consuming. During a reset procedure, the functionalities, which may be required, are not available. Moreover, resets in response to detected voltage excursion events traceable back to mode transitions do not contribute to the requirement of safety.

On the basis of the above description, those skilled in the art will understand that there is a need to prevent from false detection of voltage excursion events, which are assumed to occur or which are considered to likely occur. The phrase "false detection" should be understood to refer to detection events, which do not affect the safety requirement to minimize the risk of unknown state. This means that the detection of voltage excursion events although detected but traceable to an operation mode transition and considered not to imply the risk of indeterministic state is considered as false detections. Preventing from false detection of such voltage excursion events contributes to the availability requirement to maximize the period of time during which functionality is available.

In order to meet the aforementioned need, a mode-controlled voltage excursion detector and a method of operating thereof are suggested. In particular, the sensitivity of the mode-controlled voltage excursion detector is temporarily reduced over a predetermined period of time in order to disable excursion event signals which relate to voltage excursion events, which are assumed to occur or considered to likely occur during that predetermined period of time.

Figure 3:
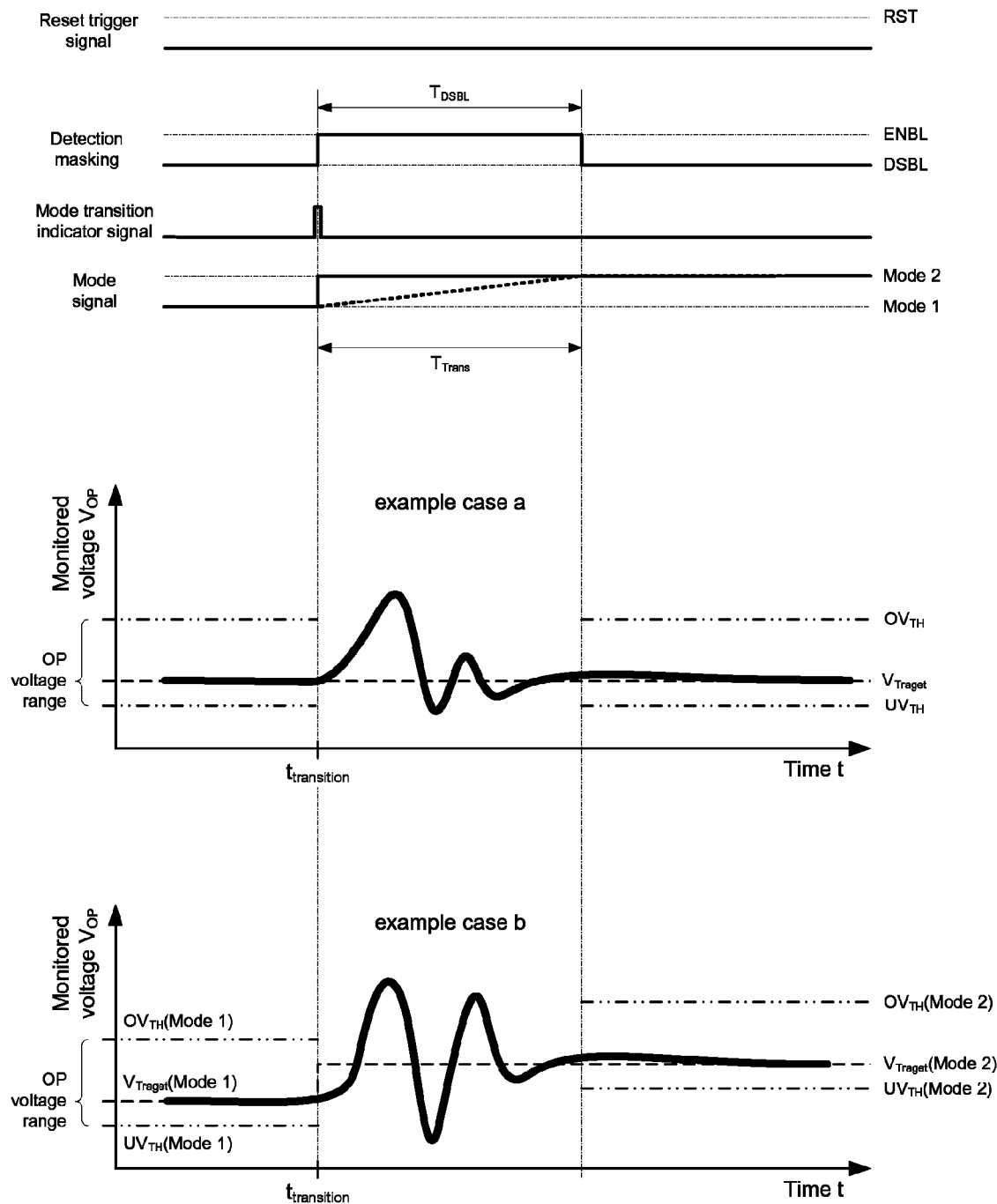
FIG. 3 schematically illustrates diagrams showing exemplary changes in the power supply voltage over time during mode transition and signals over time present at a mode-controlled voltage excursion detector according to an example of the present application.

FIG. 3 schematically illustrates diagrams showing two exemplary changes in the voltage over time of power supply supplying current to an electronic circuitry during mode transition. The monitored supply voltage $V_{OP}$ of the electronic load represented by the electronic circuitry is shown as a function of time. At a given point in time, the electronic circuitry, e.g. one or more components thereof, is subjected to an operation mode transition. For instance, the information about the mode transition may be obtained from a mode signal indicative of a current mode, in which the electronic circuitry is actually operated, from a mode transition signal indicative of the mode transition.

The mode transition of the electronic circuitry may be accompanied by a voltage excursion as illustratively depicted in FIG. 3. In exemplary case a, the voltage excursion may be caused by a switching on or off of one or more components of the electronic circuitry in response to mode transition. In exemplary case b, the voltage excursion may be caused by changing of the target supply voltage of the electronic circuitry in response to mode transition.

The possibility of voltage excursions in response to mode transitions are foreseeable and such voltage excursion may occur during the period of mode transition or during a predetermined period of time after the mode transition event. For the sake of explanation, these periods of time are referred to as transition period $T_{Trans}$.

Since the voltage excursion occurring during or after the mode transition is expected to occur or is considered to likely occur, event detection is masked for a predetermined period of time $T_{DSBL}$. The masking or disabling period $T_{DSBL}$ may substantially correspond to the transition period $T_{Trans}$ but should not be understood to be limited thereto. The event detection masking may be applied to mask/disable the event output such as the output of a reset trigger signal by the voltage excursion detector.

Figure 4:
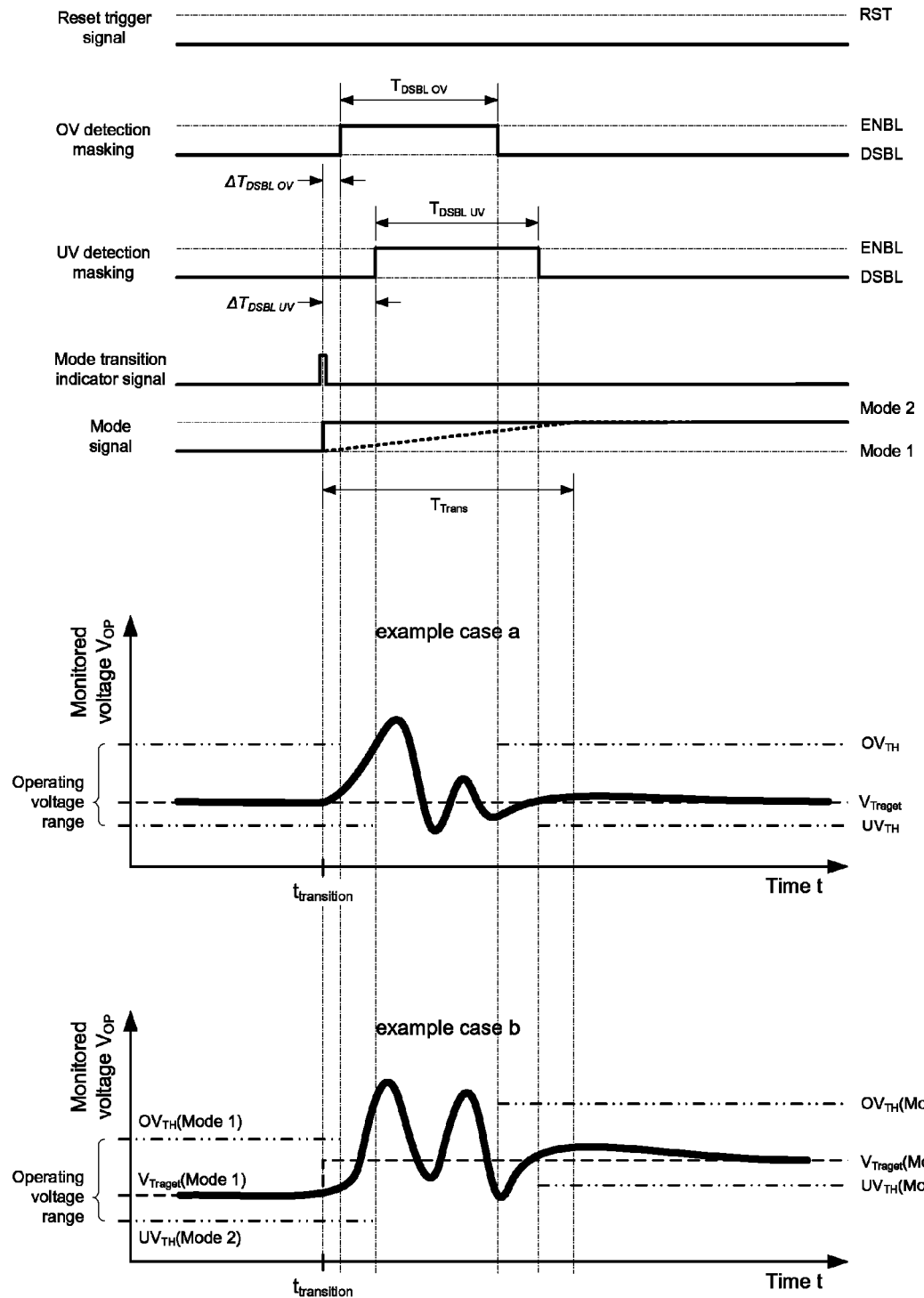
FIG. 4 schematically illustrates diagrams showing exemplary changes in the power supply voltage over time during mode transition and signals over time present at a mode-controlled voltage excursion detector according to a further example of the present application.

With regard to FIG. 4, further examples to selectively and individually mask detection events are illustratively shown with regard to the aforementioned two exemplary cases described above with reference to FIG. 3. The masking of overvoltage excursion events and undervoltage excursion events may be separately defined. For instance, overvoltage excursion events are masked for a predetermined period of time $T_{DSBL\ OV}$ starting after a predetermined offset period $\Delta T_{DSBL\ OV}$ from at least one of the start of the mode transition and the indication of the mode transition. Undervoltage excursion events are masked for a predetermined period of time $T_{DSBL\ UV}$ starting after a predetermined offset period $\Delta T_{DSBL\ UV}$ from at least one of the start of the mode transition and the indication of the mode transition. The individual masking periods $T_{DSBL\ OV}$ and $T_{DSBL\ UV}$ may the same or different. The individual offset periods $\Delta T_{DSBL\ OV}$ and $\Delta T_{DSBL\ UV}$ may the same or different.

A mode-controlled voltage excursion detector for detecting overvoltage and undervoltage excursion events has been described above with reference to FIGS. 3 and 4. Those skilled in the art will immediately understand that the above taught principles are likewise applicable to mode-controlled voltage excursion detectors for detecting at least one of overvoltage and undervoltage excursion events.

Figure 5:
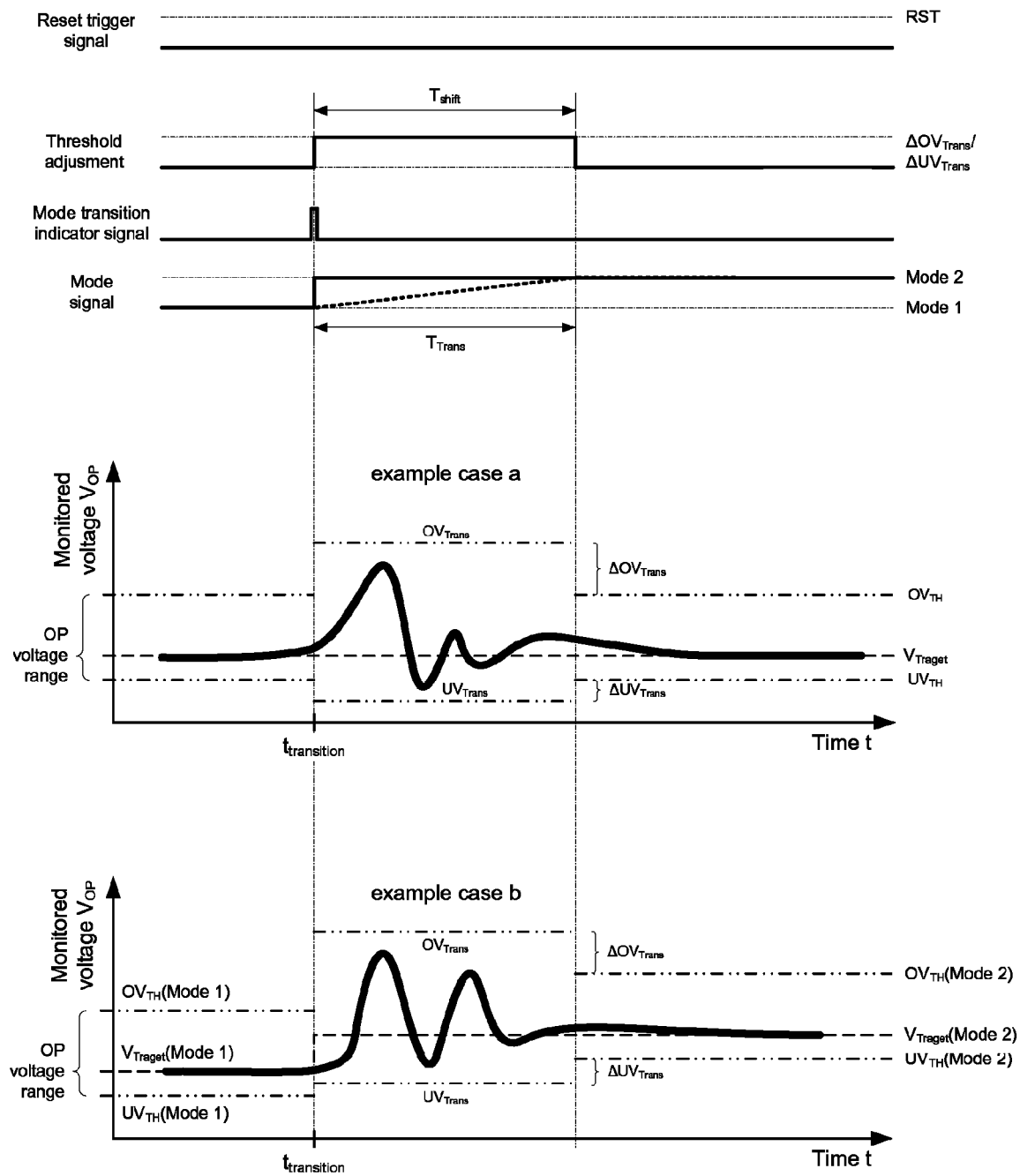
FIG. 5 schematically illustrates diagrams showing exemplary changes in the power supply voltage over time during mode transition and signals over time present at a mode-controlled voltage excursion detector according to a further example of the present application.

FIG. 5 schematically illustrates diagrams showing two exemplary changes in the voltage over time of power supply supplying current to an electronic circuitry during mode transition. The monitored supply voltage $V_{OP}$ of the electronic load represented by the electronic circuitry is shown as a function of time. At a given point in time, the electronic circuitry, e.g. one or more components thereof, performs an operation mode transition. Again, the mode transition of the electronic circuitry may be accompanied by a voltage excursion as illustratively depicted in FIG. 5. In exemplary case a, the voltage excursion may be caused by a switching on or off of one or more components of the electronic circuitry in response to mode transition. In exemplary case b, the voltage excursion may be caused by changing of the target supply voltage of the electronic circuitry in response to mode transition.

Since the voltage excursion occurring during or after the mode transition is expected to occur or considered to likely occur, at least one or the overvoltage and undervoltage thresholds is adjusted for a predetermined period of time $T_{shift}$. The overvoltage and/or undervoltage thresholds are adjustable individually. In particular, the adjustment of the overvoltage and/or undervoltage thresholds considers the expected variation range of voltage excursions of the monitored supply voltage $V_{OP}$ caused by and attributable to the mode transition. Detection of voltage excursions exceeding or falling below the adjusted overvoltage and/or undervoltage thresholds is still enabled because such voltage excursions are not considered to be caused in response to the transition of the operation mode.

The adjustment period $T_{shift}$ may substantially correspond to the transition period $T_{Trans}$ but should not be understood to be limited thereto.

As exemplarily illustrated in FIG. 5, the adjusted overvoltage threshold may for instance be raised by an offset $\Delta OV_{Trans}$ during the adjustment period $T_{shift}$ and the adjusted undervoltage threshold may for instance be lowered by an offset $\Delta UV_{Trans}$ during the adjustment period $T_{shift}$. With reference to the example case a, the adjusted overvoltage threshold $OV_{Trans}=OV_{TH}+\Delta OV_{Trans}$ and the undervoltage threshold $UV_{Trans}=UV_{TH}-\Delta UV_{Trans}$. With reference to the example case b, the overvoltage threshold $OV_{Trans}=OV_{TH}(\text{Mode 2})+\Delta OV_{Trans}$ and the undervoltage threshold $UV_{Trans}=UV_{TH}(\text{Mode 2})-\Delta UV_{Trans}$.

Figure 6:
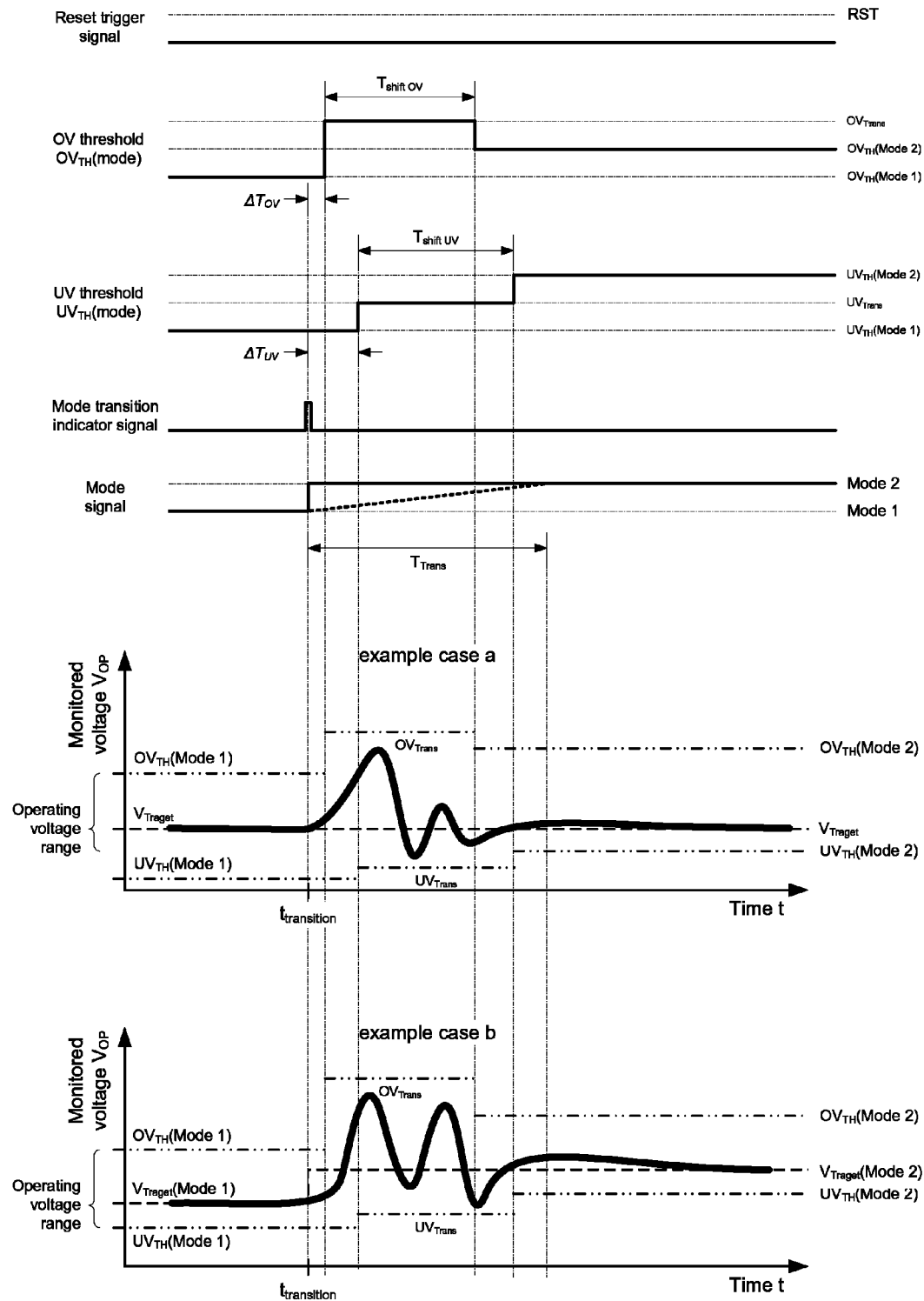
FIG. 6 schematically illustrates diagrams showing exemplary changes in the power supply voltage over time during mode transition and signals over time present at a mode-controlled voltage excursion detector according to a further example of the present application.

With regard to FIG. 6, further examples to selectively and individually adjust the thresholds are illustratively shown with regard to the aforementioned two exemplary cases described above with reference to FIG. 5. The adjustment of the overvoltage and undervoltage thresholds may be separately and individually defined. For instance, overvoltage threshold may be adjusted for a predetermined period of time $T_{shift\ OV}$ starting a predetermined offset period $\Delta T_{shift\ OV}$ after at least one of the start of the mode transition and the indication of the mode transition. Undervoltage threshold may be adjusted for a predetermined period of time $T_{shift\ UV}$ starting a predetermined offset period $\Delta T_{shift\ UV}$ after at least one of the start of the mode transition and the indication of the mode transition. The individual adjustment periods $T_{shift\_OV}$ and $T_{shift\_UV}$ may the same or different. The individual offset periods $\Delta T_{shift\_OV}$ and $\Delta T_{shift\_UV}$ may the same or different.

With reference to FIG. 6, the overvoltage and/or undervoltage thresholds as a function of the operation mode is further illustratively shown. Such overvoltage and/or undervoltage thresholds dependent on the operation mode may be in particular used in combination with a target supply voltage $V_{Traget}$(mode) dependent on the operation mode as illustratively shown in example case b. The adjusted overvoltage and/or undervoltage thresholds may be also a function of the operation mode and in particular a function of the mode transition including at least one of the origin operation mode and the target operation mode of the mode transition.

A mode-controlled voltage excursion detector for detecting overvoltage and undervoltage excursion events has been described above with reference to FIGS. 5 and 6. Those skilled in the art will immediately understand that the above taught principles are likewise applicable to mode-controlled voltage excursion detectors for detecting at least one of overvoltage and undervoltage excursion events.

The above explained functionality will be further described with reference to block diagrams schematically illustrating a mode-controlled voltage excursion detector in accordance with an example of the present application in the following.

Figure 7:
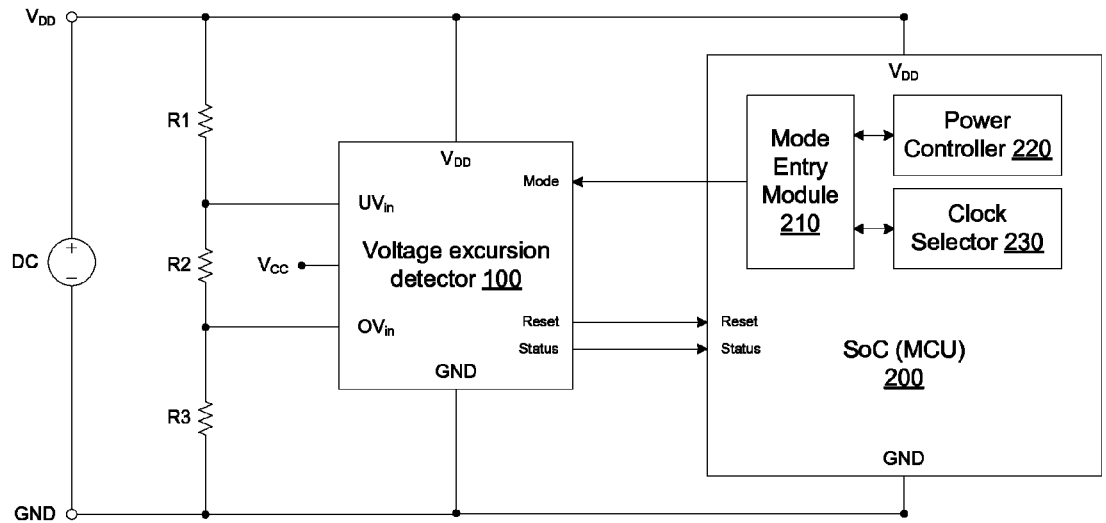
FIG. 7 schematically shows a block diagram depicting a mode-controlled voltage excursion detector and an electronic load according to an example of the present application.

FIG. 7 schematically shows a block diagram depicting a mode-controlled voltage excursion detector 100 and an electronic load representing an electronic circuitry according to an example of the present application. The electronic load is supplied with current provided by a power supply, which is herein exemplified as a direct current (DC) power supply. The supply voltage applied to the electronic load is monitored by a mode-controlled voltage excursion detector 100 connected in parallel to the electronic load to the power supply. The electronic load may be a controller/processor based electronic circuitry but should not be limited thereto. For the sake of illustration, the electronic load is exemplarily illustrated as a SoC or MCU 200, which comprises a Mode Entry (ME) module 210 configured to control the operation modes and the mode transitions between them in all functional states as exemplifies above. The Mode Entry (ME) module 210 may be operatively coupled to further modules of the SoC or MCU 200 for enabling the mode controlling functionality thereof. In particular, the Mode Entry (ME) module 210 may be operatively coupled to a power controller 220 and a clock selector and controller 230.

A signal relating to the operation mode is for instance provided by the Mode Entry (ME) module 210 and supplied to the mode-controlled voltage excursion detector 100, which are operatively coupled with each other. The signal relating to the operation mode should be understood to be indicative of information about the current operation mode and/or information about a mode transition. The information relating to the operation mode may be a mode vector, which is a bit sequence coding operation mode information. Mode transitions are detectable by comparing mode vectors.

Figure 8:
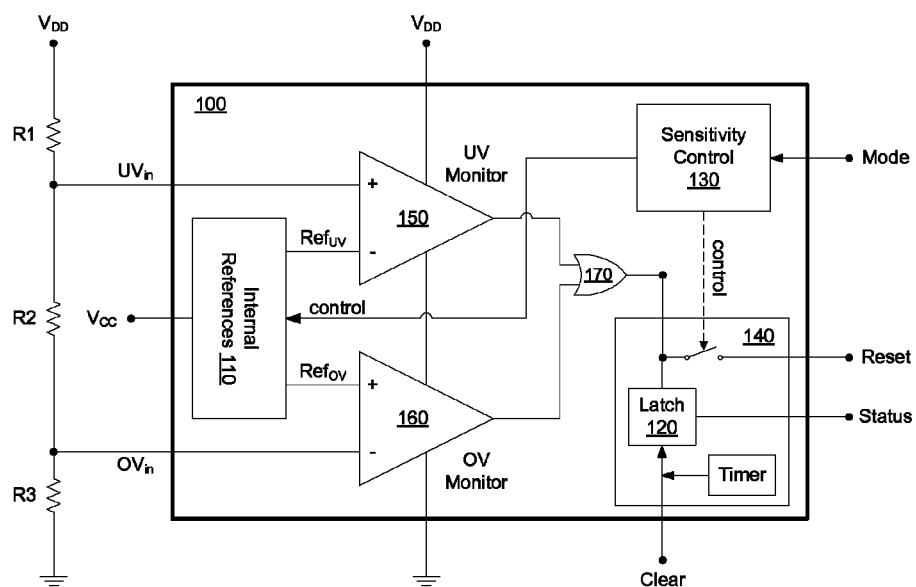
FIG. 8 schematically shows a block diagram depicting a mode-controlled voltage excursion detector according to an example of the present application.

The mode-controlled voltage excursion detector 100, which is further exemplified in FIG. 8, comprises input terminals, the input terminal $UV_{in}$ thereof connected to an input of an undervoltage comparator/monitor 150 and the input terminal $OV_{in}$ thereof connected to an input of an overvoltage comparator/monitor 160. The overvoltage and undervoltage thresholds are inter alia definable by selection of the resistors R1, R2 and R3 in dependency of at least one voltage reference signal $Ref_{OV}$, $Ref_{UV}$ supplied by the an internal voltage reference source 110 to the overvoltage and undervoltage comparators/monitors 160 and 150. The overvoltage comparator/monitor 160 and undervoltage comparator/monitor 150 each have a respective input for the voltage reference signal. The at least one voltage reference signal $Ref_{OV}$, $Ref_{UV}$ supplied by the internal voltage reference source 110 may be adjustable. In particular the internal voltage reference 110 may supply two separate voltage reference signals $Ref_{OV}$ and $Ref_{UV}$ to the overvoltage comparator/monitor 160 and the undervoltage comparator/monitor 150, respectively. The voltage reference signal $Ref_{OV}$ is representative of the overvoltage threshold $OV_{TH}$ and the voltage reference signal $Ref_{UV}$ is representative of the undervoltage $UV_{TH}$. In the context of the present application, the external wiring of the inputs, at which the voltage for being monitored by the overvoltage comparator/monitor 160 and the undervoltage comparator/monitor 150 are applied, may be understood to be part of the mode-controlled voltage excursion detector 100, herein the exemplary resistors R1, R2 and R3.

The overvoltage and undervoltage comparators/monitors 160 and 150 output event detection signals once an overvoltage excursion event and an undervoltage excursion event has been detected, respectively. The outputs of the overvoltage and undervoltage comparators/monitors 160 and 150 are operatively coupled to an OR-element 170, which outputs a voltage excursion event signal if at least one of the inputted voltage excursion event signals is applied. The output of the OR-element 170 is further operatively coupled to the voltage excursion event signal output terminal, which is herein designated as reset signal output.

For selectively adjusting the sensitivity of the mode-controlled voltage excursion detector 100, a sensitivity control module 130, to which the information relating to the operation mode is provided. The sensitivity control module 130 is configured to detect a mode transition from the inputted operation mode related information.

In an example of the present application, the sensitivity control module 130 is configured to temporarily disable the outputting of the voltage excursion event signals as already described above with reference to FIGS. 3 and 4. The disabling of the outputting of the voltage excursion event signals may for instance be implemented by a switch 140 may be interposed in the signal path to the voltage excursion event signal output, e.g. herein between the OR-element 170 and the voltage excursion event signal output terminal, herein Reset terminal. The switch 140 is operatively coupled to and controllably operated by the sensitivity control module 130. Accordingly, by operating the switch 140 the sensitivity control module 130 allows for selectively enabling and disabling the outputting of voltage excursion event signals. The switch 140 may be understood as any switching element, in particular any switching element actuatable by an electric control signal. For instance, the switch 140 may be a transistor, a relay and the like. A latch 120 may be further provided to store a voltage excursion event signal. The latch 120 may be cleared by a trigger signal supplied to a respective terminal of the mode-controlled voltage excursion detector 100 and/or by a trigger signal generated by a timer.

Figure 10:
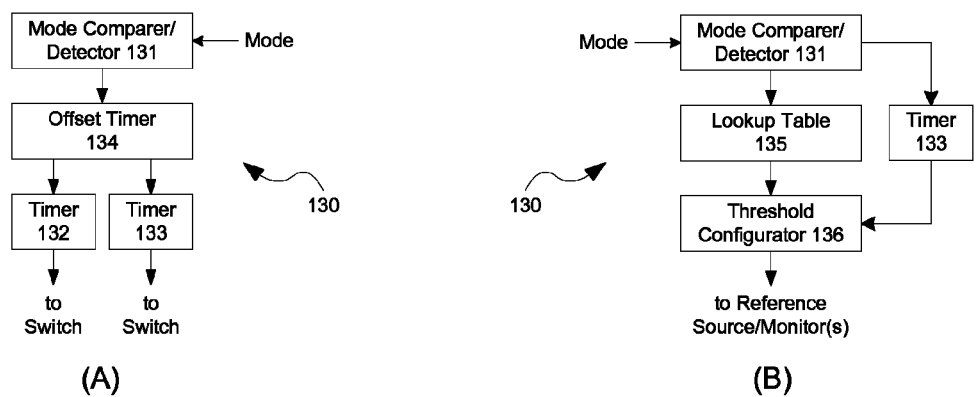
FIG. 10 schematically shows a block diagram depicting further examples of the sensitive control module of the voltage excursion detector.
Figure 11:
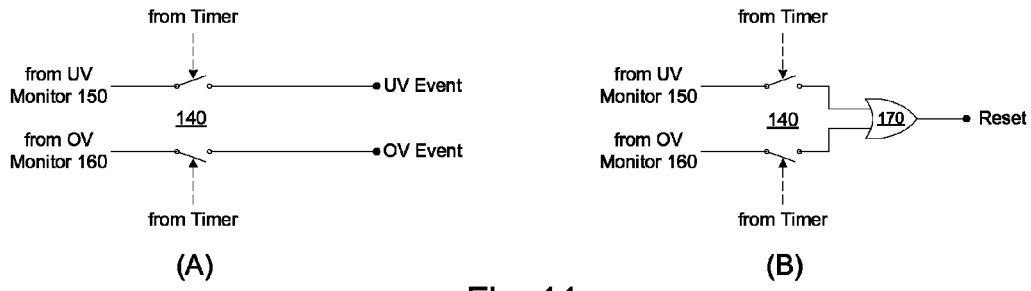
FIG. 11 schematically shows a block diagram depicting further examples of switching implementations of the voltage excursion detector.

As aforementioned, the overvoltage and undervoltage event signals may be disabled temporarily and individually. Please refer to FIG. 11 schematically illustrating the event signal switching parts of the mode-controlled voltage excursion detector 100 according to further examples thereof. The separate switches may be controlled by a common timer or the separate switches may individually controlled by respective separate timers. FIG. 10 shows in example (A) of the illustrated examples of a sensitivity control module 130 with two separate timers 132 and 133 each for switch 140. The timers 132 and 133 may be configurable to define the at least one masking period, during which at least one of the overvoltage and undervoltage detection is disabled, and the at least one offset period. The timers 132 and 133 may be fixedly configured, for instance by external wiring or at time of manufacturing of the mode-controlled voltage excursion detector 100, and/or may be configurable during operation for instance through a configuration and control interface (not shown). Further, the illustrated example of the sensitivity control module 130 may comprise an offset timer 134, which may be fixedly configured, for instance by external wiring or at time of manufacturing of the mode-controlled voltage excursion detector 100, and/or may be configurable during operation for instance through a configuration and control interface (not shown). The offset timer 134 is configured to and applicable for starting the separate timers 132 and 133 after a defined offset period or individually defined offset periods as already described above with reference to FIG. 4.

In another example of the present application, the sensitivity control module 130 is configured to temporarily adjust the overvoltage and undervoltage thresholds as already described above with reference to FIGS. 5 and 6. The sensitivity control module 130 configured to detect mode transitions is for instance operatively coupled to the internal voltage reference 110, which supplies at least one voltage reference signal to the overvoltage and undervoltage comparators/monitors 160 and 150. By adjusting the at least one voltage reference signal, the overvoltage and undervoltage thresholds are temporarily adjusted.

As aforementioned, the overvoltage and undervoltage thresholds may be adjusted temporarily and individually. Please refer to FIG. 10 schematically illustrating example (B) of the sensitivity control module 130 of the mode-controlled voltage excursion detector 100 according to further examples thereof. The adjustment of the overvoltage and/or undervoltage thresholds is controlled by a threshold configurator 136 operatively coupled to the overvoltage and/or undervoltage monitoring part of the mode-controlled voltage excursion detector 100. For the sake of illustration, the threshold configurator 136 is herein operatively coupled to internal voltage reference 110. The threshold configurator 136 may receive one or more timer signals or may make use of one or more timer signals to individually adjust at least one of the overvoltage threshold and undervoltage threshold.

The threshold configurator 136 may be configurable to adjust the overvoltage and/or undervoltage threshold by a common offset or individual offsets, the at least one offset may be relative or absolute. Alternatively or additionally, the threshold configurator 136 may be configured with one or more absolute threshold values. The threshold configurator 136 may be fixedly configured, for instance by external wiring or at time of manufacturing of the mode-controlled voltage excursion detector 100, and/or may be configurable during operation for instance through a configuration and control interface. Further, the threshold configurator 136 may be configurable to define the at least one shifting period, during which at least one of the overvoltage and undervoltage thresholds is adjusted, and the at least one offset period. The threshold configurator 136 may be fixedly configured, for instance by external wiring or at time of manufacturing of the mode-controlled voltage excursion detector 100, and/or may be configurable during operation for instance through a configuration and control interface.

A lookup table may be also implemented with example (A) of the sensitivity control module 130 shown in FIG. 10. The lookup table may comprises records associating mode information with timing information and eventually thresholds information, may be provided. In particular, such the lookup table 135 may for instance associate mode information specifying a mode transition from one specified mode to another specified mode with at least one masking period, and eventually at least one offset period, to be applied for the specified mode transition. Analogously, the lookup table may for instance associate mode information specifying a mode transition from one specified mode to another specified mode with one or more of at least one threshold adjusting information (relative or absolute threshold offset(s) and/or threshold value(s)), at least one shifting period and at least one offset period to be applied for the specified mode transition. Those skilled in the art will understand that the lookup table is merely one possibility to allow for implementing mode information specific sensitivity control of the voltage excursion detection. Such a lookup table may be configurable.

The operation of mode-controlled the voltage excursion detector 100 is further exemplary described with reference to FIG. 12, which schematically shows a flow diagram of the excursion event detection, and with reference to FIG. 13, which schematically shows a flow diagram of the temporary sensitivity adjustment. The mode-controlled voltage excursion detector is in particular a voltage excursion detector with temporary adjustable sensitivity for monitoring a supply voltage of a power supply applied to a load as described above. The mode-controlled voltage excursion detector comprises at least one voltage input operatively coupled to the power source; an excursion event output for outputting voltage excursion event signals; a sensitivity control input for receiving a signal indicative of potential voltage excursions; a voltage monitor; and a sensitivity control module.

The voltage monitor 150, 160 is operatively coupled to the at least one voltage input and the excursion event output. The mode-controlled voltage excursion detector is configured to monitor the supply voltage, to detect an excursion event if the supply voltage exceeds or falls below at least one defined threshold, to generate an excursion event signal upon detection of the excursion event and to provide the generated excursion event signal to the excursion event output for being outputted.

The sensitivity control module 130 is operatively coupled to the sensitivity control input and configured to receive the signal indicative of potential voltage excursions. The sensitivity control module is further configured to disable the outputting of an excursion event signal generated during a defined period of time in response to the reception of the signal, which triggers the disabling of the outputting. The potential voltage excursions indicated by the signal are expected to occur during the defined period of time.

The mode-controlled voltage excursion detector may comprise at least one of an overvoltage monitor 160 configured to detect an excursion event if the supply voltage $V_{DD}$ exceeds an overvoltage threshold $OV_{TH}$; and an undervoltage monitor 150 configured to detect an excursion event if the supply voltage $V_{DD}$ falls below an undervoltage threshold $UV_{TH}$.

The mode-controlled voltage excursion detector 100 may further comprise a reference source 110 operatively coupled to the voltage monitor 160, 150. The reference source 110 is provided to generate at least one reference signal $Ref_{OV}$, $Ref_{UV}$, which is supplied to the voltage monitor 160, 150.

The at least one reference signal $Ref_{OV}$, $Ref_{UV}$ is representative of the at least one defined threshold $OV_{TH}$, $UV_{TH}$.

Figure 12:
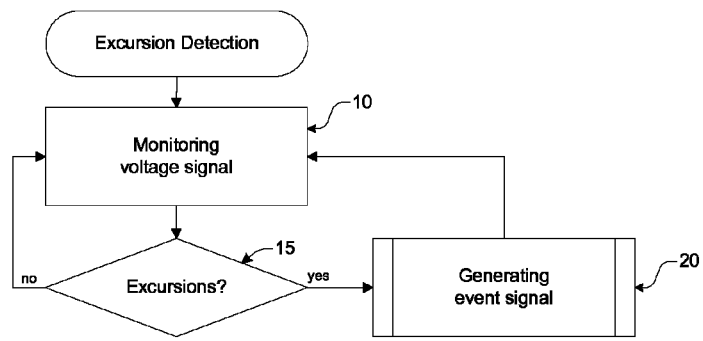
FIG. 12 schematically shows a flow diagram of the excursion event detection of a mode-controlled voltage excursion detector according to an example of the present application, and FIG. 13 schematically shows a flow diagram of the temporary sensitivity adjustment of a mode-controlled voltage excursion detector according to an example of the present application
Figure 13:
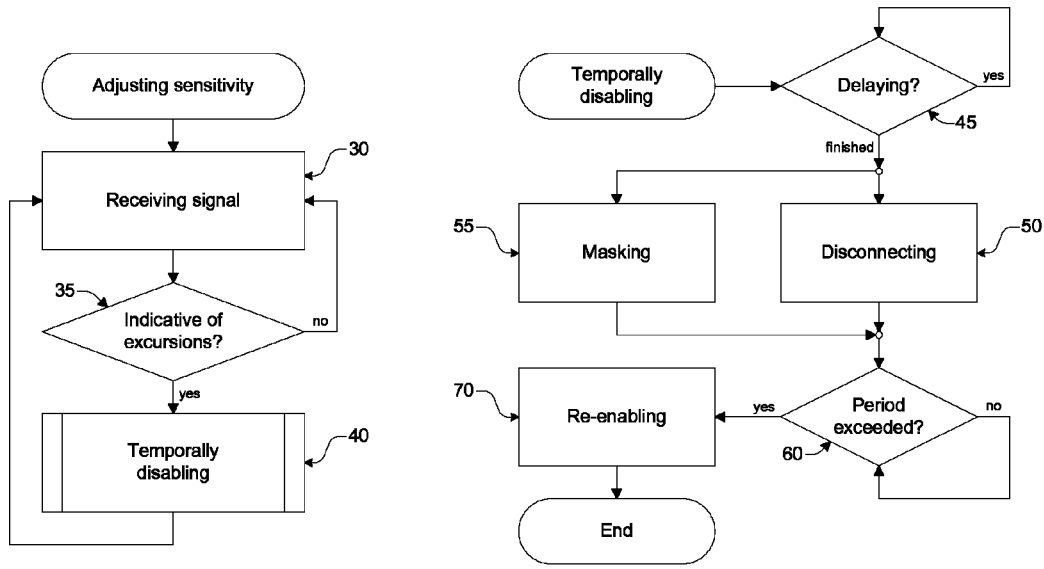

With reference to FIG. 12, the mode-controlled voltage excursion detector monitors the supply voltage $V_{DD}$ (cf. 10) and detects an excursion event if the supply voltage $V_{DD}$ exceeds or falls below at least one defined threshold $OV_{TH}$, $UV_{TH}$ (cf. 15). The defined threshold may comprise at least one of an overvoltage threshold $OV_{TH}$ and an undervoltage threshold $UV_{TH}$. An excursion event is detected if the supply voltage $V_{DD}$ exceeds an overvoltage threshold $OV_{TH}$ and/or if the supply voltage $V_{DD}$ falls below an undervoltage threshold $UV_{TH}$.

Upon detection of the excursion event, the voltage monitor 160, 150 generates an excursion event signal (cf. 20), which is provided to the excursion event output for being outputted via the excursion event output.

The sensitivity of the mode-controlled voltage excursion detector temporarily adjusted. The sensitivity control module is adapted to receive signals including signals indicative of potential voltage excursions (cf. 30). The signals may be received from the load 200 and the signal may comprise information relating to an operation mode of the load. On the basis of the information relating to an operation mode of the load, the sensitivity control module 130 is capable of detecting signals indicative of potential voltage excursions (cf. 35). For instance, the signal may comprise information about a current operation mode of the load. The sensitivity control module 130 detects a mode transition by comparing the information about the current operation mode with information about a previous operation mode stored at the sensitivity control module 130. The detection of a mode transition is indicative of potential voltage excursions. Moreover, the signal comprises information indicative of mode transition currently performed at the load 200.

If a signals indicative of potential voltage excursions has been detected (cf. 35), the detection of excursion events is temporarily disabled (cf. 40). The temporarily disabling may disable the excursion detector from outputting any excursion event signals or may disable the excursion detector from outputting excursion event signals considered to occur in response to the received signal indicative of potential voltage excursions and to match with the expected potential voltage excursions.

The temporary disabling may be delayed by a defined time period (cf. 45), which may be predefined and/or configurable.

The temporary disabling may comprise a disconnecting of the excursion event output in order to disable the outputting of excursion event signals (cf. 50). The voltage excursion detector comprises a switching element 140, which is operatively coupled to the sensitivity control module 130 and interconnected between the voltage monitor 160, 150 and the excursion event output. The sensitivity control module 130 is configured to operatively control the switching element 140 to disconnect the voltage monitor 160, 150 and the excursion event output during the defined period of time in response to the reception of the signal.

The temporary disabling may comprise a masking of excursion events. The masking is performed in that the at least one threshold is adjusted during the defined period of time such that a voltage excursion, which is expected to occur at the defined period of time is not detected because of the adjusted at least one threshold. The sensitivity control module may be configured to adjust the at least one threshold. In particular, the reference source 110 may be operatively coupled to and operably controlled by sensitivity control module 130, which is configured to adjust the at least one reference signal generated by the reference source 110.

The temporary disabling is maintained for the defined period of time, within which the potential voltage excursions may occur in response to the reception of the signal indicative of potential voltage excursions (cf. 60). After that period of time, the detection of voltage excursions is re-enabled in that the measures taken to temporarily disable the outputting of an excursion event signal are reversed. The excursion event output may be reconnected and the defined threshold may be reconfigured.

Those skilled in the art will understand that the teachings of the present application are not limited to voltage excursion detectors allowing for detecting overvoltage events and undervoltage events. Rather, the teachings are applicable to any voltage excursion detectors allowing for detecting at least one of overvoltage events and undervoltage events.

In the foregoing, the cause of voltage excursions has been described because of capacitive unloading, charging or reloading processes in the electronic load. It should be understood that the teachings of the present application are not limited to sensitivity adjusting of a voltage excursion detector for blocking the outputting of voltage excursion signals expected to occur due to capacitive unloading, charging or reloading processes. The voltage excursion detector according to the teachings of the present application may be likewise applied in conjunction with electric load for blocking the outputting of voltage excursion signals expected to expected to occur due to any processes changing the electrical characteristics of the electric load at such an extent that voltage excursion events at the supply voltage provided by the power supply of the electric load are to be expected to occur. The voltage excursion may be a result of changes of the resistance, inductivity and/or capacity.

Although the examples illustratively shown in FIGS. 3/4 and 5/6 have been described separately with reference thereto, those skilled in the art will understand from the description relating to the examples illustratively shown in FIGS. 7 and 8 as well as FIGS. 10 and 11, that components and functionality described with respect to one of the examples may be likewise implemented and made use of in combination with another of the examples.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective components, nodes, units or devices, for example via intermediate components. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between blocks are merely illustrative and that alternative embodiments may merge blocks or circuit elements or impose an alternate decomposition of functionality upon various blocks or circuit elements. Thus, it is to be understood that the implementation depicted herein are merely exemplary, and that in fact many other implementation can be designed which achieve the same functionality. For example, the switch 140 may be included in the sensitivity control module 130.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Also for example, in one embodiment, the illustrated examples may be implemented as circuitry located on a single integrated circuit or within a same device. For example, the mode-controlled voltage excursion detector 100 may be part of the electronic load, e.g., the microcontroller or system-on-chip 200. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as "computer systems".

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A mode-controlled voltage excursion detector apparatus for monitoring a supply voltage of a power supply applied to a load, the detector apparatus comprising:

at least one voltage input operatively coupled to the power supply;

an excursion event output for outputting voltage excursion event signals from the detector apparatus;

a sensitivity control input for receiving from a mode entry module a signal indicative of potential voltage excursions, the signal comprising information about a current operation mode of the load;

a voltage monitor operatively coupled to the at least one voltage input and the excursion event output, wherein the voltage monitor is configured to monitor the supply voltage, to detect an excursion event if the supply voltage exceeds or falls below at least one defined threshold, to generate from the voltage monitor an excursion event signal of the voltage excursion event signals upon detection of the excursion event and to provide the generated excursion event signal to the excursion event output of the detector apparatus for being outputted; and a sensitivity control module operatively coupled to the sensitivity control input and configured to receive the signal indicative of the potential voltage excursions from the sensitivity control input, wherein the sensitivity control module is further coupled to the voltage monitor and configured to disable the outputting of an excursion event signal generated during a defined period of time in response to the reception of the signal, which triggers the disabling of the outputting.

2. The device of claim 1, wherein the voltage monitor further comprises at least one of an overvoltage monitor configured to detect an excursion event if the supply voltage exceeds an overvoltage threshold; and an undervoltage monitor configured to detect an excursion event if the supply voltage falls below an undervoltage threshold.

3. The device of claim 1, wherein the detector apparatus further comprises:

a switching element operatively coupled to the sensitivity control module and interconnected between the voltage monitor and the excursion event output, wherein the sensitivity control module is configured to operatively control the switching element to disconnect the voltage monitor and the excursion event output during the defined period of time in response to the reception of the signal.

4. The device of claim 1, wherein the sensitivity control module is further configured to adjust the at least one threshold during the defined period of time such that the potential voltage excursion, expected to occur at the defined period of time, is masked from being detected the defined period of time in response to the reception of the signal.

5. The device of claim 4, wherein the detector apparatus further comprises:

a reference source operatively coupled to the voltage monitor, wherein the reference source is provided to generate at least one reference signal, which is supplied to the voltage monitor, wherein the at least one reference signal is representative of the at least one defined threshold.

6. The device of claim 5, wherein the reference source is operatively coupled to and operably controlled by sensitivity control module, which is configured to adjust the at least one reference signal generated by the reference source.

7. The device of claim 1, wherein the signal is received from the load, wherein the signal comprises information relating to an operation mode of the load.

8. The device of claim 7, wherein the signal comprises information about a current operation mode of the load, wherein the sensitivity control module is configured to detect a mode transition by comparing the information about the current operation mode with information about a previous operation mode stored at the sensitivity control module.

9. The device of claim 7, wherein the signal comprises information indicative of mode transition currently performed at the load.

10. A method of operating a mode-controlled voltage excursion detector apparatus comprises method steps of
monitoring a supply voltage of a power supply applied to a load,
receiving, from a mode entry module, a signal indicative of potential voltage excursions, the signal comprising information about a current operation mode of the load; and
disabling the outputting, from the detector apparatus, of an excursion event signal generated during a defined period of time in response to the reception of the signal indicative of potential voltage excursions, which triggers the disabling of the outputting,
wherein the mode-controlled voltage excursion detector apparatus is capable of monitoring the supply voltage;
detecting an excursion event if the supply voltage exceeds or falls below at least one defined threshold;
generating the excursion event signal upon detection of the excursion event; and
providing the generated excursion event signal to the excursion event output for being outputted via an excursion event output.

11. The method of claim 10, wherein the detecting of an excursion event comprises at least one of
detecting an excursion event if the supply voltage exceeds an overvoltage threshold; and
detecting an excursion event if the supply voltage falls below an undervoltage threshold.

12. The method of claim 10, wherein the disabling of the outputting of the excursion event signal comprises:
disconnecting the excursion event output in order to disable the outputting of excursion event signals.

13. The method of claim 10, wherein the disabling of the outputting of the excursion event signal comprises:
adjusting, at an internal reference of the mode-controlled voltage excursion detector apparatus, by a sensitivity control of the mode-controlled voltage excursion detector apparatus, the at least one defined threshold of the mode-controlled voltage excursion detector apparatus during the defined period of time such that a voltage excursion, which is expected to occur at the defined period of time, is masked from being detected, to effect the disabling the outputting of the excursion event signal generated during the defined period of time in response to the reception of the signal indicative of potential voltage excursions.

14. The method of claim 10, further comprising:
delaying, by the mode-controlled voltage excursion detector apparatus, the disabling of the outputting of the excursion event signal by a defined period of time.

* * * * *